United States Patent [19]

Tran et al.

[11] Patent Number: 4,975,600
[45] Date of Patent: Dec. 4, 1990

[54] BICMOS TTL OUTPUT DRIVER CIRCUIT

[75] Inventors: Hiep V. Tran, Carrollton; Pak K. Fung, Dallas, both of Tex.

[73] Assignee: Texas Instruments Incorporated, Dallas, Tex.

[21] Appl. No.: 430,060

[22] Filed: Oct. 30, 1989

Related U.S. Application Data

[63] Continuation of Ser. No. 198,273, May 25, 1988, abandoned.

[51] Int. Cl.[5] .................... H03K 19/017; H03K 19/02
[52] U.S. Cl. ................................. 307/446; 307/448; 307/451; 307/475; 307/443
[58] Field of Search ............... 307/446, 448, 449, 451, 307/473, 475, 270, 570, 263, 264

[56] References Cited

U.S. PATENT DOCUMENTS 4,324,991 4/1982 Tamaki .................................. 307/443
4,558,234 10/1985 Suzuki et al. ....................... 307/425
4,730,132 3/1988 Watanabe et al. .................. 307/446

Primary Examiner—Timothy P. Callahan
Attorney, Agent, or Firm—Stanton C. Braden; Raymond E. Fritz, Jr.; Melvin Sharp

[57] ABSTRACT

An output driver circuit for reducing output terminal ringing in integrated circuits has a plurality of pull-down transistors each having first, second and third terminals. A plurality of voltage setting devices each are connected in series to the second terminal of one of the pull-down transistors. An input is connected to the common third terminals of the plurality of pull-down transistors, and an output pull-up circuit is connected between the output of the circuit and the first terminals of the plurality of pull-down transistors. Multiple output driver circuits, each having an input delayed with respect to the others, can be connected together with a common output.

19 Claims, 2 Drawing Sheets

BICMOS TTL OUTPUT DRIVER CIRCUIT

This application is a continuation of application Ser. No. 198,273, filed May 25, 1988, now abandoned.

BACKGROUND OF THE INVENTION

Output ringing is the voltage oscillation at an output terminal of an integrated circuit device caused by the parasitic inductance in the integrated circuit package and wiring. The faster the output switching speed, the greater the voltage oscillation swing at the output terminal.

Standard CMOS TTL (complementary metal oxide semiconductor transistor transistor logic) circuits have been plagued with output ringing as the switching rise and fall times of its output buffer reaches for instance around 10 ns (nano seconds). The ringing on the output terminal of the standard CMOS TTL circuit can raise the output logic low level about the required TTL specification, and thus cause the circuit to fail to measure up to its required access time.

CMOS output driver circuits used in many integrated circuit (IC) devices have a n-channel pull-down transistor and use sophisticated timing delay schemes in combination with the pull-down transistor in an attempt to reduce the output ringing to an acceptable level. However, at super high switching speeds, for instance around under 10 ns access times, timing delays are vulnerable to integration circuit process variations. Additionally, circuits incorporating such schemes are difficult to design.

OBJECTS OF THE INVENTION

It is therefore an object of this invention to provide a new and improved output driver circuit.

It is another object of the invention to provide a new and improved TTL output driver circuit.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are achieved by an output driver circuit comprising a plurality of pull-down transistors, each pull-down transistor including a first terminal, a second terminal, and a common third terminal; a plurality of voltage setting devices connected in series, each voltage setting device being connected in a one-to-one correspondence with the second terminal of one of the plurality of pull-down transistors; an input connected to the common third terminals of the plurality of pull-down transistors; an output; and an output pull-up circuit connected to the output and the first terminals of the plurality of pull-down transistors.

A second embodiment of the invention uses two of the above described output driver circuits which include a common output. By delaying, by a predetermined time, the input signal to the input of one of the output driver circuits, output ringing can be potentially reduced to an even greater extent than by using a single output driver circuit. This embodiment also offers increased current again.

DETAILED DESCRIPTION OF THE INVENTION

Figure 1:
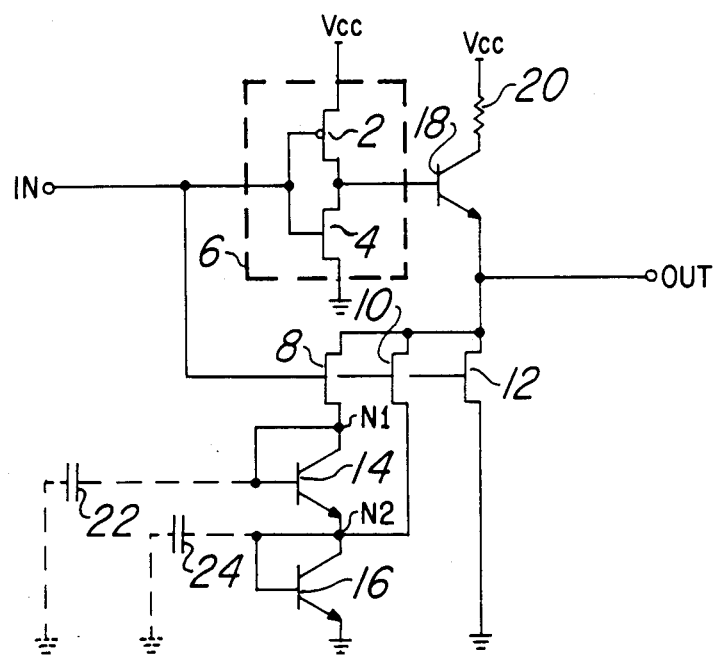
FIG. 1 is a schematic drawing of a first preferred embodiment of the invention.

FIG. 1 illustrates schematic drawing of a first preferred embodiment of the invention using BiCMOS (bipolar complementary metal oxide semiconductor) components. Inverter 6 comprises p-channel transistor 2 and n-channel transistor 4. The gates of transistors 2 and 4 are tied together and are connected to input node IN. The drains of transistors 2 and 4 are tied together, forming the output for inverter 6, and are connected to the base of bipolar transistor 18. The source of transistor 2 is connected to the circuit supply voltage of Vcc and the source of transistor 4 is connected to circuit ground. The collector of transistor 18 is connected to resistor 20 which is in turn connected to circuit supply voltage Vcc. The emitter of transistor 18 is tied to the circuit output node OUT. Together, transistor 18 and load 20 (which can either be a passive or active device such as an active load) comprise a pull-up circuit. Pull-down n-channel transistors 8, 10 and 12 have a common gate and are connected at their drains to node OUT. Transistors 8, 10, and 12 can alternatively be p-channel transistors, bipolar transistors, NMOS transistors, PMOS transistors and combinations thereof. The source of transistor 8 is connected to the collector and base of diode configured bipolar transistor 14 at node N1. The emitter of transistor 14 is connected to the collector and base of diode configured transistors 16 at node N2. Thus, as shown, diode configured transistors 14 and 16 are connected in a one-to-one correspondence with a respective transistor from a group comprising transistors 8, 10, and 12. Transistor 16's emitter is tied to circuit ground. The source of transistor 10 is connected to node N2 and the source of transistor 12 is connected to circuit ground. Optional capacitor 22 is connected between ground and the base of transistor 14, and optional capacitor 24 is connected between ground and the base of transistor 16.

The operation of the circuit illustrated in FIG. 1 is is explained below.

A logic low level at input node IN results in a logic high voltage level at the output of inverter 6. This logic high voltage level turns on bipolar transistor 18 and yields a logic high voltage level at node OUT which is one base-emitter voltage drop below the voltage at the base of transistor 18.

A logic high voltage level at input node IN results in turning on pull-down transistors 8, 10, and 12 in addition to pulling output node OUT toward a logic low voltage level. However, as the voltage of output node OUT reaches the voltage level of node N1 as node OUT approaches a logic low level, node N1 effectively becomes a capacitive load for node OUT since the effect of node N1 in this situation is to hold the voltage at node OUT at the voltage level of node N1. When node OUT drops in voltage below the voltage level of node N1 due to the action of transistors 10 and 12, the current through transistor 8 reverses since the voltage of its source at node N1 is greater than the voltage of its drain at node OUT. Therefore, transistor 8 tries to pull node OUT up in voltage. However, the circuit drives transistors 10 and 12 harder to successfully oppose this action. As node OUT reaches the voltage level of node N2 a similar phenomenon occurs as with node N1. Node N2 acts as a capacitive load for node OUT. When node OUT drops in voltage below node N2, the current through transistor 10 reverses since the voltage of it source at node N2 is greater than the voltage of its drain at node OUT. However, transistor 12 successfully opposes this action to pull node OUT down to circuit ground. Capacitors 22 and 24 are connected to the circuit with dashed lines to show that they are optionally included to improve the reduction of current during the logic high input state at node IN.

Figure 2:
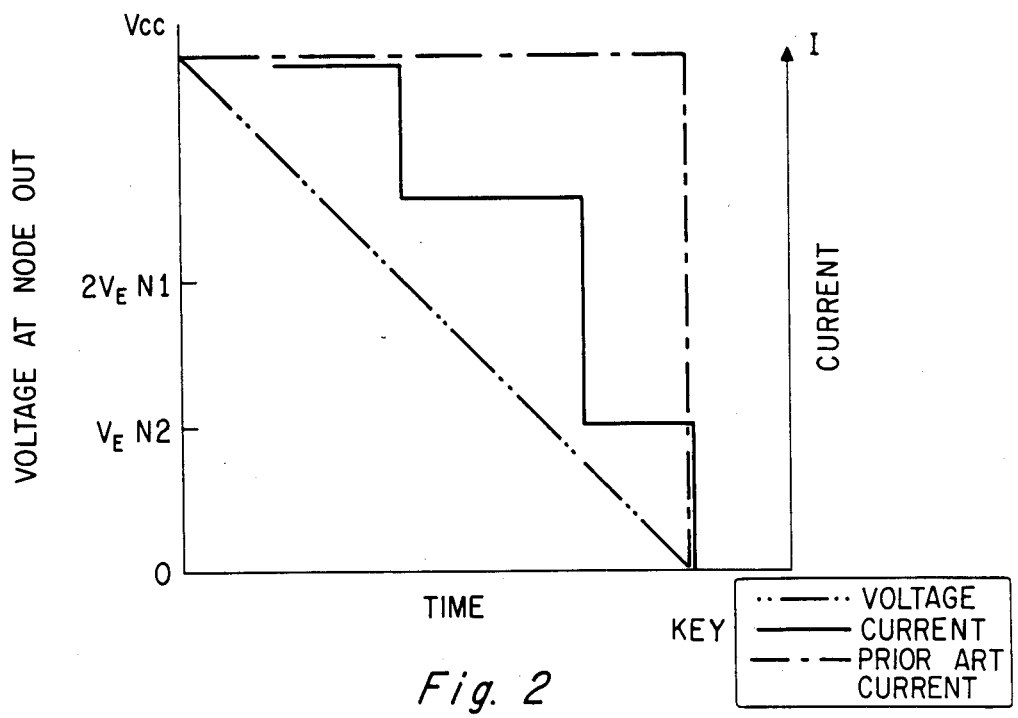
FIG. 2 is a plot of selected voltage and current vs. time.

FIG. 2 is plot of voltage at node OUT vs. time in addition to being a plot of the sum of current through transistors 8, 10, and 12 vs. time. Also shown is a plot of prior art current vs. time for an output driver circuit without the benefit of the invention. The sum of current vs. time plot is greatly exaggerated for ease of illustration and explanation purposes. In reality, the sum of current vs. time plot would more closely resemble that of the node OUT vs. time plot rather than the stair step type pattern of FIG. 2. FIG. 2 shows the decreasing voltage at node OUT from just below Vcc to zero which represents, for instance, circuit ground. The current plot is drawn in a staircase fashion to point out the capacitive holding values at nodes N1 and N2. FIG. 2 shows a substantial drop in current when the voltage passes these holding values to demonstrate the reverse currents through transistors 10 and 12 as discussed above. FIG. 2 also shows that node N1 is two base-emitter voltages, 2Vbe, above circuit ground and that node N2 is one base-emitter voltage, Vbe, above circuit ground, assuming in this example transistors 14 and 16 are the same size.

The voltage on an output line with inductance is equal to the inductance, L, times the change in current with respect to time, di/dt, through the line. As the change in current with respect to time increases, the magnitude of the voltage of the output ringing increases. As shown by FIG. 2 and comparing the current labeled prior art current with the current labeled simply current, the change in current with respect to time of the invention is greatly reduced as against the prior art change in current with respect to time. Therefore, the output ringing phenomenon is greatly reduced by the invention.

Note that transistors 14 and 16 can be substituted with diodes or with other voltage setting devices such as capacitors, or n-channel and p-channel transistors. Also note that the embodiment of the invention can be altered so as to use transistors selected from the group consisting of n-channel transistors, p-channel transistors, bipolar transistors, NMOS transistors, PMOS transistors and combinations thereof for transistors 8, 10, and 12. Furthermore, by adding more transistors in the common gate fashion of transistors 8, 10, and 12 as well as more voltage setting devices, di/dt can be reduced even more, resulting in reduced output ringing to even a greater extent.

Figure 3:
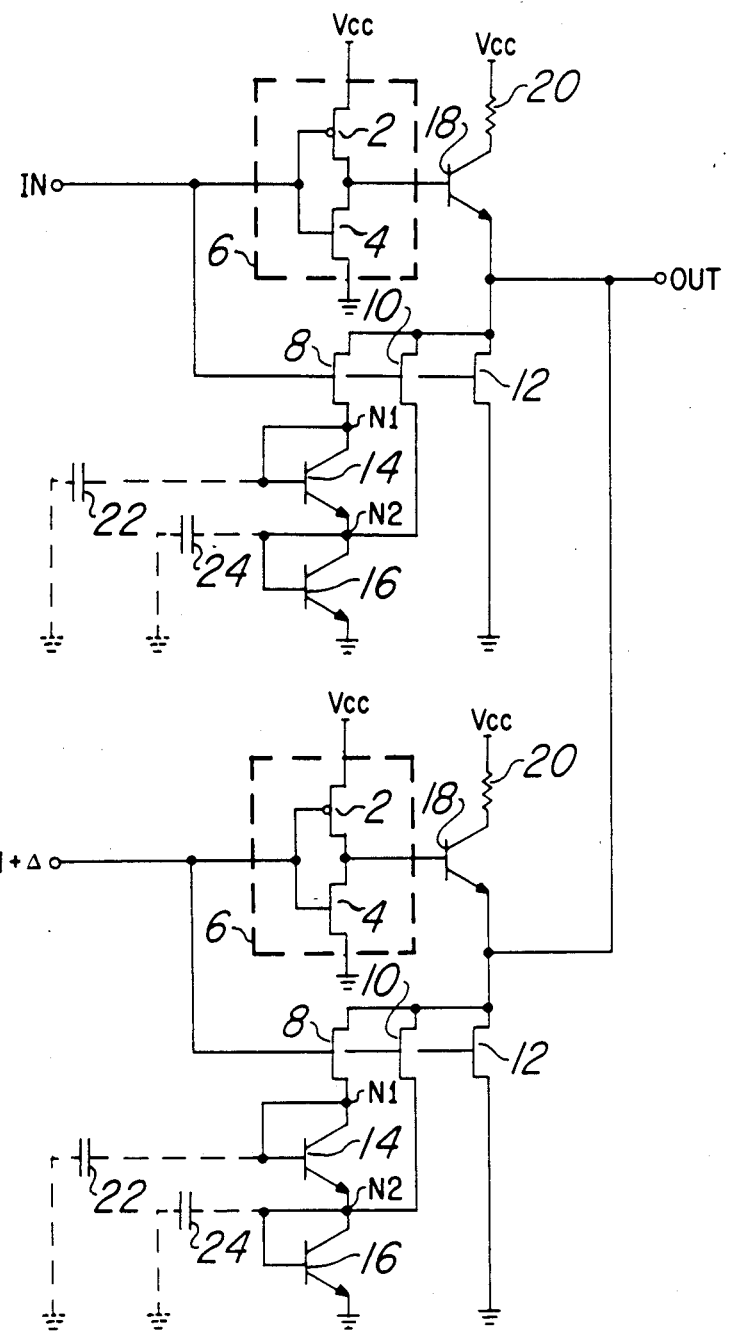
FIG. 3 is a schematic drawing of a second preferred embodiment of the invention.

A second preferred embodiment of the invention is illustrated in the schematic drawing of FIG. 3. The driver circuit of FIG. 1 is doubled and combined at node OUT as shown. However, the input, IN+Δ into one of the circuits is time delayed from the input, IN, of the other circuit. By carefully choosing the time period of delay, the di/dt through node OUT can be greatly reduced such that even lower output ringing reduction capability is possible than that achieved with just one driver circuit. The time delay may be achieved by a time delay circuit which produces the signal at input IN delayed by time Δt at input IN+Δ.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by persons of ordinary skill in the art having reference to this description. It is contemplated that all such changes and additional embodiments are within the true scope and spirit of the invention as claimed below.

We claim:

1. An output driver circuit which comprises:
   a plurality of pull-down transistors, each pull-down transistor including a first terminal, a second terminal, and a common third terminal;
   a plurality of voltage setting devices connected in series between the second terminal of the first of said plurality of pull-down transistors and a reference voltage, the last transistor of said plurality having its second terminal coupled to said reference voltage and the remaining transistors of said plurality having their second terminals coupled to respective ones of said voltage setting devices;
   an input connected to said common third terminals of said plurality of pull-down transistors;
   an output; and
   an output pull-up circuit connected to said output and said first terminals of the plurality of pull-down transistors.

2. An output driver circuit as recited in claim 1 wherein said plurality of pull-down transistors comprise transistors selected from the group consisting of n-channel transistors, p-channel transistors, bipolar transistors, NMOS transistors, PMOS transistors and combinations thereof.

3. An output driver circuit as recited in claim 1 wherein said first terminal is the drain, said second terminal is the source, and said third terminal is the gate.

4. An output driver circuit as recited in claim 1 wherein said output pull-up circuit comprises a bipolar transistor, and a current limiter connected to said bipolar transistor.

5. An output driver circuit as recited in claim 4 wherein said current limiter is an active device.

6. An output driver circuit as recited in claim 4 wherein said current limiter is a resistor.

7. An output driver circuit as recited in claim 1 which further includes an inverter connected to said input and said pull-up circuit.

8. An output driver circuit as recited in claim 7 wherein said inverter is a CMOS inverter.

9. An output driver circuit as recited in claim 1 further comprising capacitors coupled between said reference voltage and each one of said plurality of voltage setting devices.

10. An output driver circuit comprising:
    a plurality of first pull-down transistors, each said first pull-down transistor including a first terminal, a second terminal, and a third terminal common to each said first pull-down transistor;

a plurality of first voltage setting devices connected in series between the second terminal of the first of said plurality of first pull-down transistors and a refererence voltage, the last transistor of said plurality of first pull-down transistors having its second terminal coupled to said reference voltage, and the remaining transistors of said plurality of first pull-down transistors having their second terminals coupled between respective ones of said plurality of first voltage setting devices;

a first input connected to said common third terminals of said plurality of first pull-down transistors;

a plurality of second pull-down transistors, each said second pull-down transistor including a first terminal, a second terminal, and a third terminal common to each said second pull-down transistor;

a plurality of second voltage setting devices connected in series between the second terminal of the first of said plurality of second pull-down transistors and said reference voltage, the last transistor of said plurality of second pull-down transistors having its second terminal coupled to said refence voltage, and the remaining transistors of said plurality of second pull-down transistors having their second terminals coupled between respective ones of said plurality of second voltage setting devices;

a second input connected to said common third terminals of said plurality of second pull-down transistors;

a first output pull-up circuit connected to said output and to said first terminals of said plurality of first pull-down transistors; and a second output pull-up circuit connected to said output and to said first terminals of said plurality of second pull-down transistors.

11. An output driver circuit as recited in claim 10 wherein said plurality of pull-down transistors comprise transistors selected from the group consisting of n-channel transistors, p-channel transistors, bipolar transistors, NMOS transistors, PMOS transistors and combinations thereof.

12. An output driver circuit as recited in claim 10 wherein said first terminal is the drain, said second terminal is the source, and said third terminal is the gate.

13. An output driver circuit as recited in claim 10 wherein each said output pull-up circuit comprises a bipolar transistor, and a load connected to said bipolar transistor.

14. An output driver circuit as recited in claim 13 wherein said load is an active load.

15. An output driver circuit as recited in claim 13 wherein said load is a resistor.

16. An output driver circuit as recited in claim 10 further comprising:

a first inverter connected between said first input, and said first output pull-up circuit; and a second inverter connected between said second input, and said second output pull-up circuit.

17. An output driver circuit as recited in claim 16 wherein said inverter is a CMOS inverter.

18. An output driver circuit as recited in claim 10 further comprising:

a capacitor connected between each one of said plurality of first and second voltage setting devices and said reference voltage.

19. An output driver circuit as recited in claim 10 which further includes a time delay signal circuit connected to said second input.

* * * * *